(12) United States Patent  
Wang et al.

(10) Patent No.: US 7,865,210 B2  
(45) Date of Patent: Jan. 4, 2011

(54) EJECTABLE COMPONENT ASSEMBLIES IN ELECTRONIC DEVICES

(75) Inventors: Erik L. Wang, Redwood City, CA (US); Sean Murphy, Sunnyvale, CA (US); Tang Yew Tan, San Francisco, CA (US); Jeffrey Eugene Neaves, Duluth, GA (US); Lawrence E. Davis, Atlanta, GA (US); Sung Kim, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 738 days.

(21) Appl. No.: 11/824,032

(22) Filed: Jun. 28, 2007

(65) Prior Publication Data

US 2008/0165508 A1  Jul. 10, 2008

Related U.S. Application Data

(60) Provisional application No. 60/878,805, filed on Jan. 5, 2007.

(51) Int. Cl.  
*H04M 1/00* (2006.01)

(52) U.S. Cl. ............... 455/550.1; 455/90.3; 455/575.1; 439/325; 439/327; 439/64; 439/153; 439/160

(58) Field of Classification Search ............ 235/492, 235/486, 487, 475, 479, 441, 443, 482; 439/169, 439/325, 327, 64, 152–160, 326, 630; 455/558, 455/550.1, 90.1, 90.3, 557, 556.1, 575.1  
See application file for complete search history.

(56) References Cited

U.S. PATENT DOCUMENTS

| | | | |
|---|---|---|---|
| 5,389,001 A | 2/1995 | Broschard | |
| 5,443,395 A | 8/1995 | Wang | |
| 5,526,235 A | 6/1996 | Beason et al. | |
| 5,613,860 A * | 3/1997 | Banakis et al. | 439/64 |
| 5,653,596 A | 8/1997 | Banakis | |
| 5,726,922 A * | 3/1998 | Womble et al. | 361/726 |
| 6,146,163 A * | 11/2000 | Wu | 439/159 |
| 6,159,027 A * | 12/2000 | Kuo | 439/159 |
| 6,318,632 B1 * | 11/2001 | Grant et al. | 235/441 |
| 6,419,508 B2 * | 7/2002 | Hashimoto | 439/159 |
| 6,550,684 B1 * | 4/2003 | Zuin et al. | 235/486 |
| 7,416,427 B2 * | 8/2008 | Ting | 439/159 |
| 7,427,206 B2 * | 9/2008 | Takei et al. | 439/159 |
| 2003/0151901 A1 | 8/2003 | Nogami | |

(Continued)

FOREIGN PATENT DOCUMENTS

EP    0720259 A2    7/1996

(Continued)

*Primary Examiner*—Sujatha Sharma  
(74) *Attorney, Agent, or Firm*—Kramer Levin Naftalis & Frankel LLP (57) ABSTRACT

Electronic devices are provided with ejectable component assemblies that can be substantially flush with the external surfaces of the housings of the devices, despite variations in their manufacture. The ejectable component assemblies may include connectors coupled to circuit boards of the devices, and trays that can be loaded with removable modules, inserted through openings in the housings of the devices, and into the connectors for functionally aligning the removable modules with the circuit boards. The ejectable component assemblies may also include ejectors coupled to the housings of the devices for ejecting the trays from the connectors and, thus, from the devices themselves.

51 Claims, 9 Drawing Sheets

U.S. PATENT DOCUMENTS

2007/0023530 A1* 2/2007 Aoki et al. .................. 235/492
2007/0041578 A1* 2/2007 Ohsawa .................. 379/433.1

FOREIGN PATENT DOCUMENTS

| GB | 2 205 000 | 11/1988 |
| GB | 2205000 A | 11/1988 |
| JP | 2006127811 A | 5/2006 |
| WO | 1991000681 A1 | 1/1991 |
| WO | WO 91/00681 | 1/1991 |

\* cited by examiner

EJECTABLE COMPONENT ASSEMBLIES IN ELECTRONIC DEVICES

CROSS-REFERENCE TO RELATED APPLICATION

This claims the benefit of U.S. Provisional Application No. 60/878,805, filed Jan. 5, 2007, which is hereby incorporated by reference herein in its entirety.

BACKGROUND OF THE DISCLOSURE

The present invention can relate to apparatus and methods for improving the construction of ejectable component assemblies in electronic devices.

The proliferation of electronic devices (e.g., portable MP3 players) and the various ways in which such devices are being transported have created a need for improved construction of ejectable component assemblies for such devices.

Some known ejectable component assemblies for personal electronic devices include a tray for receiving a removable module, and a connector coupled to a circuit board within the housing of the device for receiving the tray as it is inserted through an opening in the housing and for retaining the tray such that the module is functionally aligned with the circuit board. Variations in the manufacture of such electronic devices result in, for example, variations in the distance between the circuit board and the opening in the housing through which the tray of an ejectable component assembly is to be inserted. These manufacturing variations generally create an undesirable abruptness in the profile created by the tray and the external surface of the housing about its opening once the tray has been inserted therein.

Moreover, some known ejectable component assemblies for personal electronic devices also include an ejector coupled to the circuit board of the device for ejecting the tray from the connector and, thus, the housing of the device. The manufacturing variations of the device also tend to create variations in the distance between a user external to the device and the ejector. Therefore, the interaction between the user and the ejector for ejecting a tray from the device may not function similarly in all devices due to these manufacturing variations.

SUMMARY OF THE DISCLOSURE

Personal electronic devices with ejectable component assemblies that can be substantially flush with the external surfaces of the housings of the devices, despite variations in their manufacture, are provided.

According to a particular embodiment of the present invention, there is provided an electronic device that can include a circuit board, a housing about the circuit board, and an ejectable component assembly. The ejectable component assembly can include a tray for holding a removable module, and a connector coupled to the circuit board for retaining the tray when the tray is inserted in a first direction through an opening in the housing. In one embodiment, when the tray is retained by the connector, the tray can not be inserted further in the first direction through the opening, and the tray can not be ejected in a second direction opposite to the first direction from the opening. However, the circuit board can be moved in at least one of the first direction and the second direction with respect to the opening.

In an alternative embodiment of the present invention, there is provided an electronic device that can include a circuit board with coupling circuitry, a housing enclosing the circuit board, and an ejectable component assembly. The ejectable component assembly can include a connector coupled to the circuit board for retaining a removable module when the module is inserted through an opening in the housing, and an ejector coupled to the housing for ejecting the module from the connector when the module is retained by the connector.

BRIEF DESCRIPTION OF THE DRAWINGS

The above and other features of the present invention, its nature and various advantages will become more apparent upon consideration of the following detailed description, taken in conjunction with the accompanying drawings, in which like reference characters refer to like parts throughout, and in which.

DETAILED DESCRIPTION OF THE DISCLOSURE

Apparatus and methods are provided for improving the construction of ejectable component assemblies, and are described below with reference to FIGS. 1-13.

FIGS. 1-11 show an embodiment of personal electronic device 10 including at least one ejectable component assembly. The term "personal electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, printers, or combinations thereof. In some cases, the electronic devices may perform a single function (e.g., an electronic device dedicated to playing music) and, in other cases, the electronic devices may perform multiple functions (e.g., an electronic device that plays music, displays video, stores pictures, and receives and transmits telephone calls).

In any case, these electronic devices are generally any portable, mobile, hand-held, or miniature electronic device having an ejectable component assembly constructed in accordance with the principles of the present invention so as to allow a user to listen to music, play games, record videos, take pictures, and/or conduct telephone calls, for example, wherever the user travels. Miniature personal electronic devices may have a form factor that is smaller than that of hand-held personal electronic devices, such as an iPod™ available by Apple Computer, Inc. of Cupertino, Calif. Illustrative miniature personal electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices that incorporate an ejectable component assembly may not be portable at all.

Personal electronic device 10 can include at least one user input component assembly (see, e.g., input component assembly 12) that allows a user to manipulate a function of the device, at least one device output component assembly (see, e.g., output component assembly 14) that provides the user with valuable device generated information, at least one ejectable component assembly (e.g., ejectable component assembly 16) that allows a user to insert and eject a removable module into and from the device, and a protective housing (see, e.g., housing 18) that at least partially encloses the one or more input, output, and ejectable component assemblies of the device.

I/O component assemblies 12, 14, and 16 can include any type of component assembly that receives and/or transmits digital and/or analog data (e.g., audio data, video data, other types of data, or a combination thereof). For example, input component assembly 12 may be of a variety of input component forms, including, but not limited to, sliding switches, buttons, keypads, dials, scroll wheels, touch screen displays, electronics for accepting audio and/or visual information, antennas, infrared ports, or combinations thereof. Furthermore, output component assembly 14 may be of a variety of output component forms, including, but not limited to, audio speakers, headphones, audio line-outs, visual displays, antennas, infrared ports, or combinations thereof. Moreover, ejectable component assembly 16 may be any assembly that inserts into and ejects from the device a removable module (see, e.g., module 30 of FIGS. 3 and 4) that may be of a variety of forms, including, but not limited to, integrated circuit cards (ICCs), chip cards, memory cards, flash memory cards, microprocessor cards, smart cards, such as subscriber identity module (SIM) cards, or combinations thereof, containing electronic circuitry (see, e.g., circuitry 32 of FIGS. 3 and 4) from which the device may read data and/or to which the device may write data.

Figure 1:
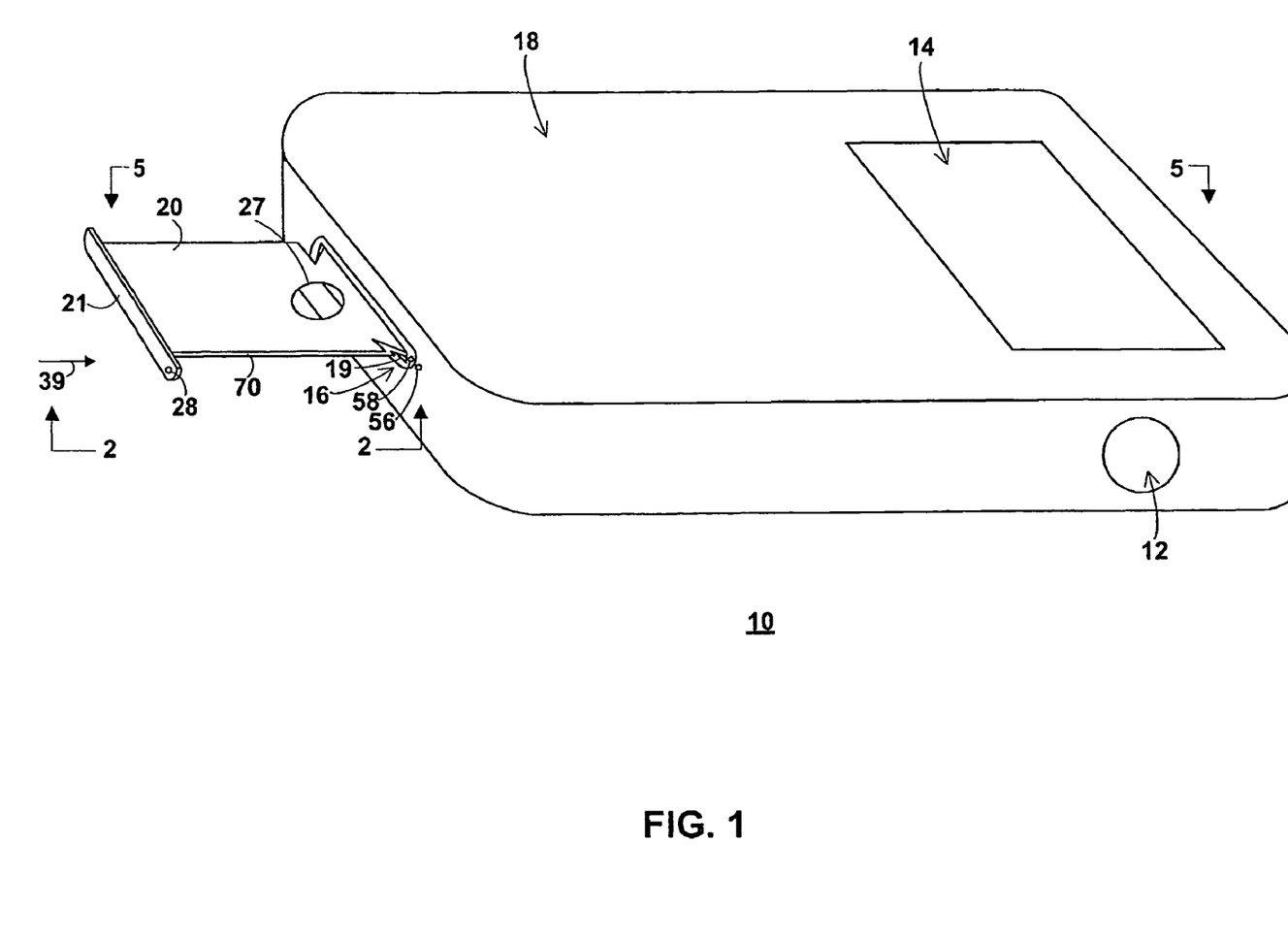
FIG. 1 is a perspective view of an exemplary personal electronic device, in a first stage of actuation, in accordance with the principles of the present invention.
Figure 2:
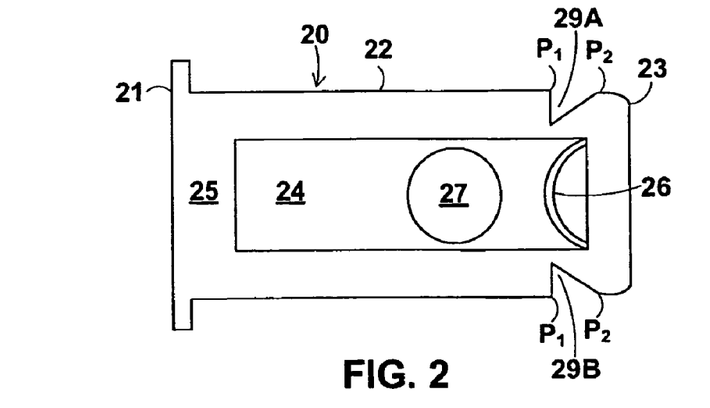
FIG. 2 is an elevational view of a portion of the personal electronic device of FIG. 1, taken from line 2-2 of FIG. 1.
Figure 3:
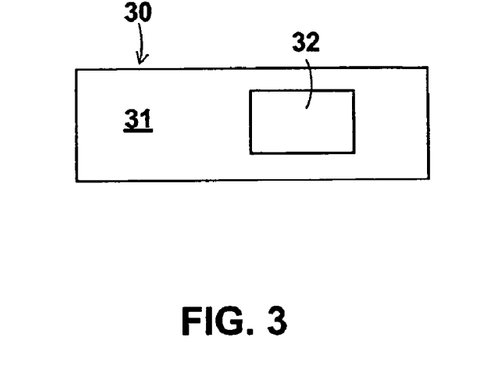
FIG. 3 is an elevational view of an embodiment of a removable module to be used with the personal electronic device of FIGS. 1 and 2 in accordance with the principles of the present invention.
Figure 4:
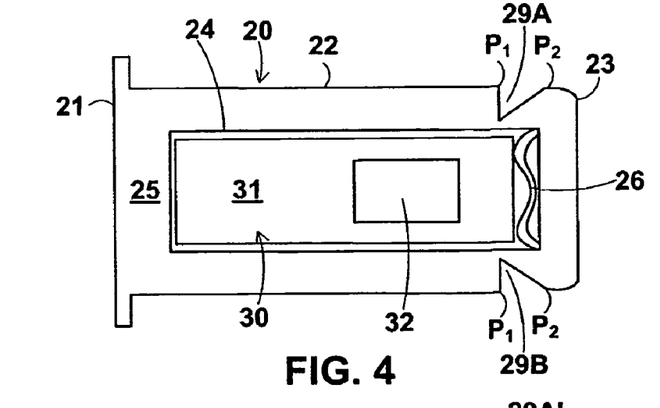
FIG. 4 is an elevational view of a portion of the personal electronic device of FIGS. 1 and 2, similar to FIG. 2, cooperating with the removable module of FIG. 3, in a second stage of actuation in accordance with the principles of the present invention.

In one embodiment of the present invention, and as shown in FIG. 1, ejectable component assembly 16 can include removable module tray 20 that may be insertable into and ejectable from housing 18 through housing opening 19 in a surface thereof. As shown in FIGS. 1, 2, and 4, for example, tray 20 can include first end 21, second end 23, and body portion 22 extending therebetween. A module holder 24 can be included in first surface 25 of body portion 22 for holding a removable module therein during use of assembly 16. Holder 24 can be sized to substantially match that of module 30, as shown in FIG. 3, such that module 30 may be snap-fitted into holder 24 by a user, and such that electronic circuitry 32 on first surface 31 of module 30 is facing away from holder 24 of tray 20 and is therefore exposed, as shown in FIG. 4. Electronic circuitry 32 can be any integrated circuit (IC), such as a microchip, silicon chip, or computer chip, that generally includes semiconductor devices and passive components that have been manufactured in the surface of a thin substrate of semiconductor material on surface 31 of module 30, such that device 10 may read data from or write data into the circuitry when module 30 is inserted into the device using ejectable component assembly 16.

A module retainer or module retaining element 26 may be coupled to one or more sides of holder 24 for retaining module 30 therein. For example, retaining element 26 may be a spring flexure coupled to tray 20 within holder 24 such that the spring flexure may be compressed by removable module 30 upon its insertion into holder 24 for tightly retaining module 30 therein, as shown in FIG. 4. Moreover, a hole, such as hole 27, can be provided through holder 24 of tray 20, such that a user may easily release module 30 from holder 24 by exerting a force on module 30 through hole 27 in a direction substantially away from holder 24 (see, e.g., the direction of arrow 33 in FIG. 10, but when tray 20 has been ejected from device 10).

Figure 5:
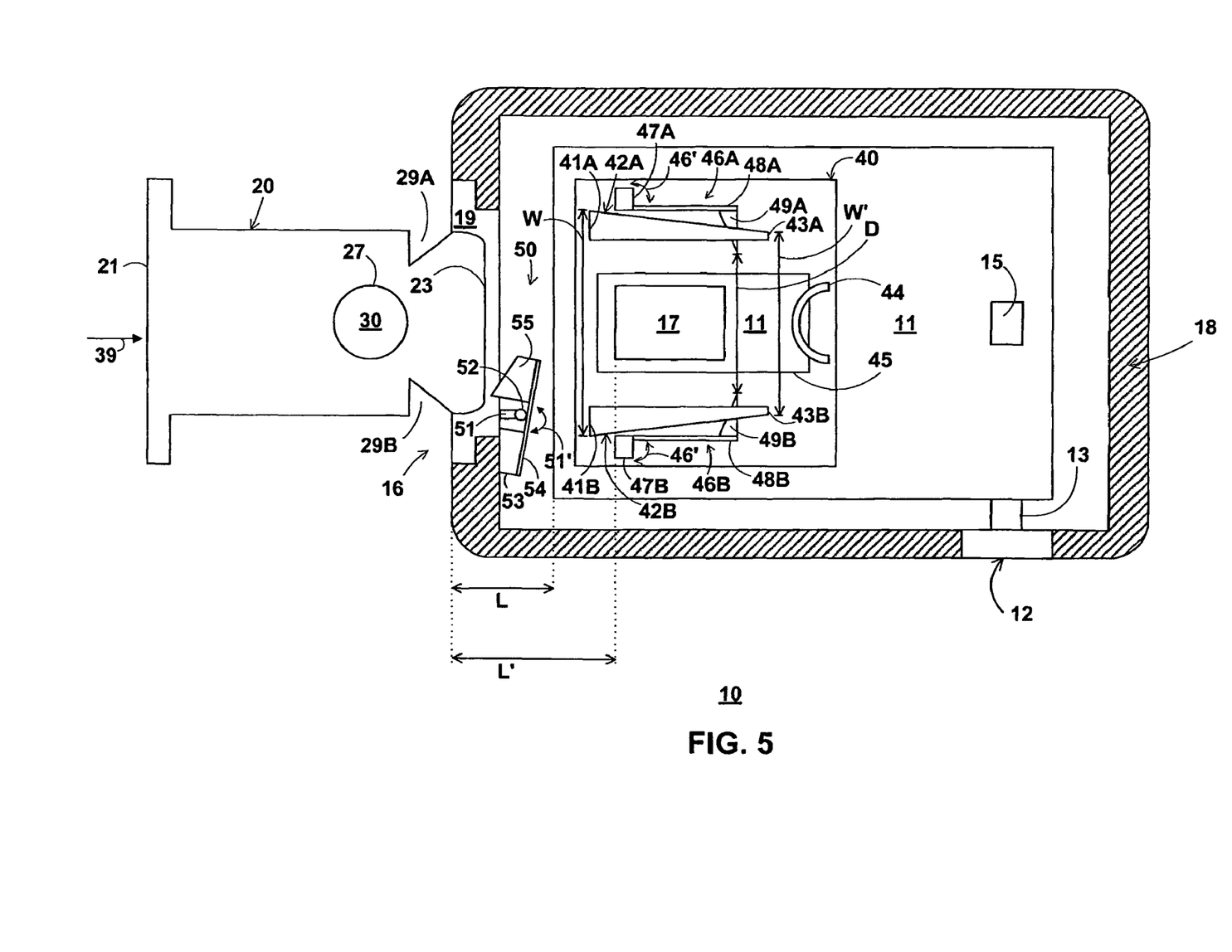
FIG. 5 is a horizontal cross-sectional view of the personal electronic device of FIGS. 1 and 2, taken from line 5-5 of FIG. 2, but cooperating with the removable module of FIGS. 3 and 4, in the second stage of actuation of FIG. 4, in accordance with the principles of the present invention.
Figure 6:
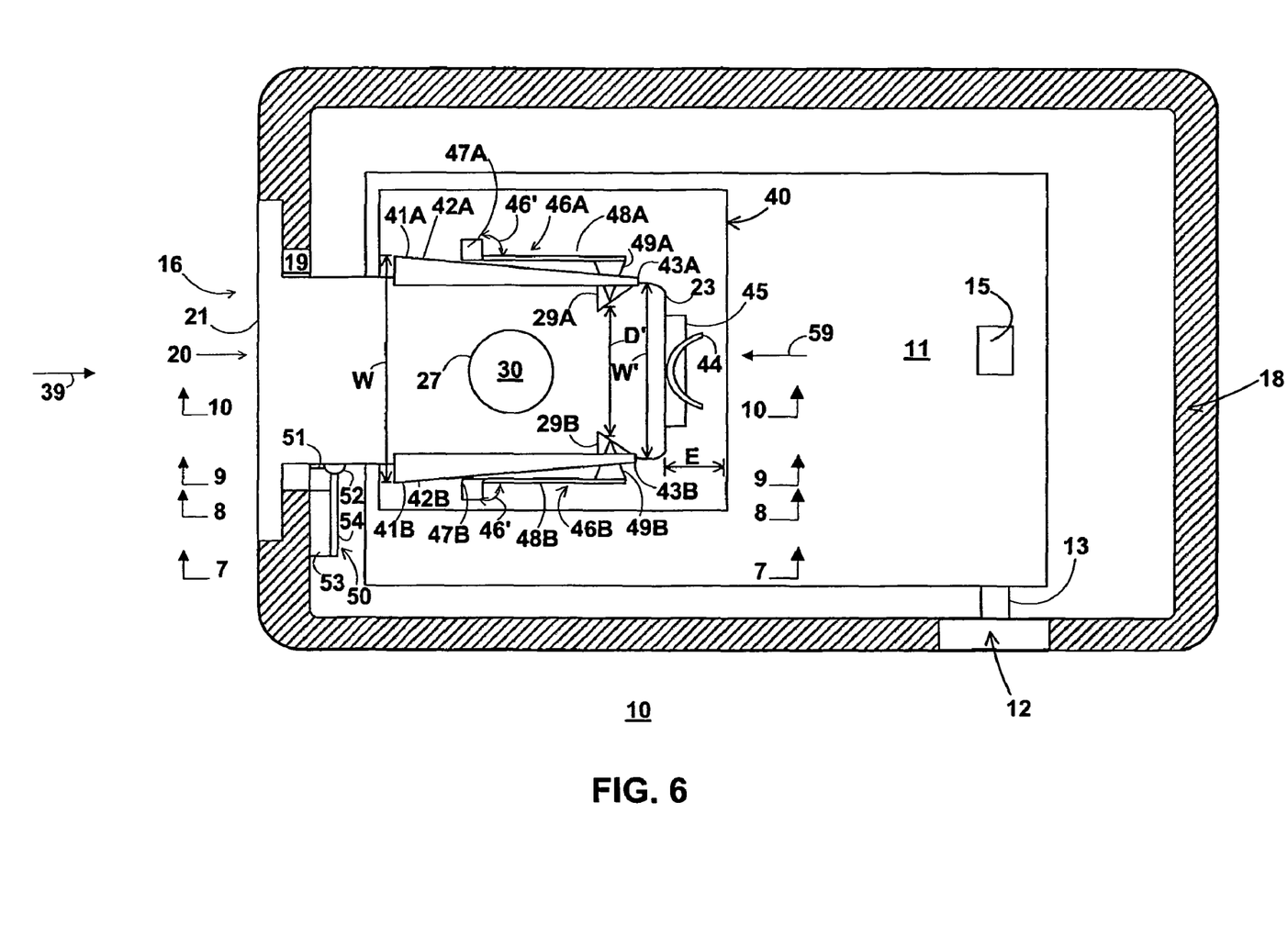
FIG. 6 is a horizontal cross-sectional view of the personal electronic device of FIGS. 1, 2, and 5, similar to FIG. 5, but in a third stage of actuation, in accordance with the principles of the present invention.

Once module 30 has been loaded into holder 24, tray 20 may be inserted into a connector that is internal to housing 18 of device 10. For example, as shown in FIGS. 5 and 6, ejectable component assembly 16 may also include a connector (see, e.g., connector 40) for receiving and holding removable tray 20 within housing 18 of device 10 such that electronic circuitry 32 of module 30 may align with and be accessed by a module reader/writer of device 10 (see, e.g., coupling circuitry 17 of FIGS. 5 and 10, as described in more detail below). Therefore, housing 18 of device 10 may be designed to protect the electrical components (e.g., I/O component assemblies 12, 14, and 16) and at least one circuit board 11 coupled thereto.

FIGS. 5 and 6 show how the signals of each I/O component assembly 12, 14, and 16 may, for example, be coupled to circuit board 11, and the signals of circuit board 11 may be coupled to each I/O component assembly 12, 14, and 16, via a respective coupling circuitry 13, 15, and 17. Each one of coupling circuitries 13, 15, and 17 can allow circuit board 11 to properly receive signals from and/or transmit signals to its respective I/O component assembly 12, 14, and 16. Each of coupling circuitries 13, 15, and 17 can include, but is not limited to, any flexible printed circuit (FPC), including one-sided, double-sided, multi-layer, dual access, rigid-flex FPCs, or combinations thereof.

Circuit board 11 may be any type of circuit board, including, but not limited to, printed circuit boards (PCBs), logic boards, printed wiring boards, etched wiring boards, and other known boards, that may be used to mechanically support and electronically connect electrical components (e.g., I/O component assemblies 12, 14, and 16 via coupling circuitries 13, 15, and 17). Circuit board 11 can, for example, be constructed using one or more layers of a non-conductive substrate and signal conducting pathways. The signal conducting pathways may exist in one or more layers or in each layer of the non-conductive substrate. The signal conducting layers, sometimes referred to as traces, members, or leads, may be a metal conductive material (e.g., copper or gold) or an optical conductive material (e.g., fiber optics). Therefore, when one or more of I/O component assemblies 12, 14, and 16 are physically and electrically coupled to board 11 via coupling circuitries 13, 15, and 17, board 11 may communicate with the one or more component assemblies of device 10 concurrently in order for the device to function properly.

Figure 10:
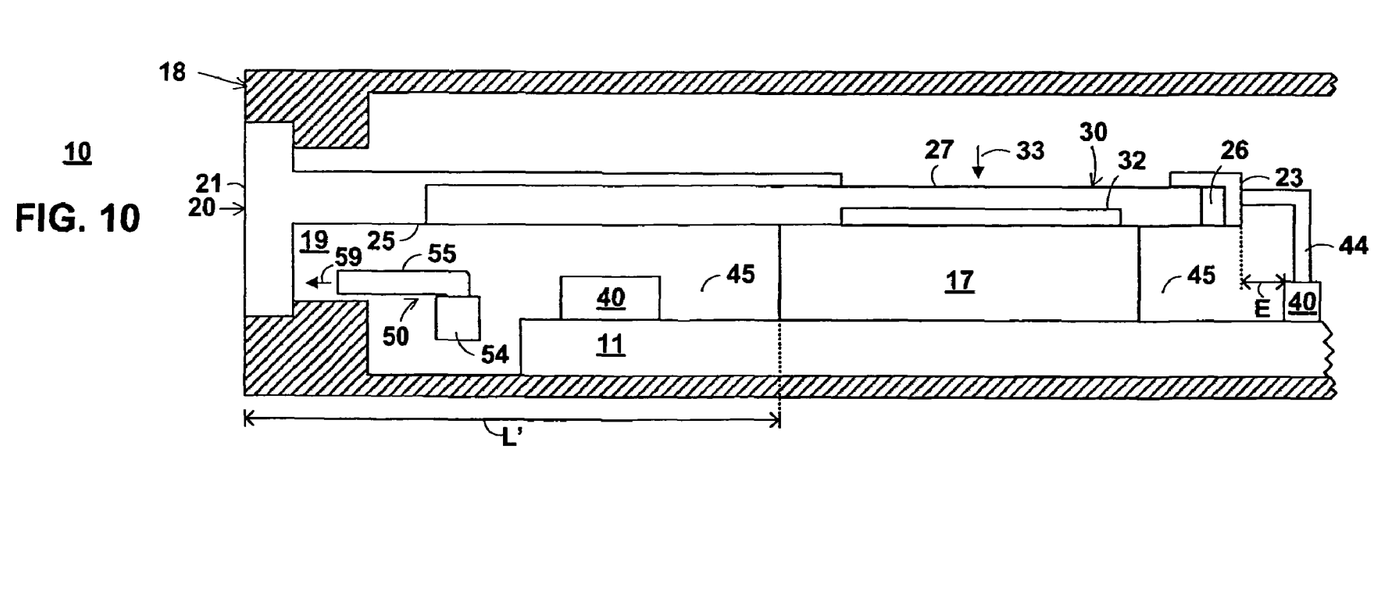
FIG. 10 is a vertical cross-sectional view of the personal electronic device of FIGS. 1, 2, and 5-9, taken from line 10-10 of FIG. 6.

FIGS. 5 and 6 show, for example, how connector 40 of ejectable component assembly 16 may be coupled to board 11 (e.g., by surface mount technology (SMT)) such that, when tray 20 loaded with module 30 is inserted into device 10 through opening 19 of housing 18 in the direction of arrow 39, connector 40 may receive, guide, and hold tray 20 such that electronic circuitry 32 of module 30 aligns with coupling circuitry 17 of circuit board 11 (also, see, e.g., FIG. 10). Although the portions of housing 18 about opening 19 may at least initially guide the insertion of end 23 of tray 20 through opening 19 in the direction of arrow 39, connector 40 can include track 42 provided by guide rails 42A and 42B extending between their respective first ends 41A and 41B and their respective second ends 43A and 43B for guiding tray 20 in the direction of arrow 39 once it has been inserted through opening 19.

In one embodiment, first end 41 of track 42 between first ends 41A and 41B of guide rails 42A and 42B, respectively, can have a width W that is greater than the width W' of the second end 43 of track 42 between second ends 43A and 43B, such that track 42 may increasingly narrow about tray 20 as tray 20 is inserted further into connector 40 of assembly 16 through opening 19 in the direction of arrow 39. Therefore, in the event that second end 23 of tray 20 happens to be inserted through opening 19 at some angle offset from the direction of arrow 39, the larger dimension of width W of first opening 41 can enable guide rails 42A and 42B of track 42 to nevertheless receive second end 23 of tray 20 therebetween and direct second end 23 of tray 20 towards second ends 43A and 43B of the guide rails in the direction of arrow 39.

FIGS. 5 and 6 also show, for example, how a tray detector or tray detecting element 44 may be provided by connector 40 for detecting when a tray (e.g., tray 20, with or without module 30 loaded therein) has been received by track 42. For example, detecting element 44 may be any circuitry capable of communicating with circuit board 11 such that board 11 can determine whether a tray has been fully loaded into a connector of the ejectable component assembly of the device (also see, e.g., FIG. 10). It is to be understood, especially with respect to FIGS. 11-13, that tray detecting element 44 can have no resistive effect on the movement of tray 20 in the direction of arrow 39 into connector 40 or in the direction of arrow 59 out of connector 40. Moreover, connector 40 may also include hole 45 therethrough, at least partially running between guide rails 42A and 42B, such that coupling circuitry 17 of board 11 may be exposed to electronic circuitry 32 of module 30 when tray 20 has been fully received by track 42 (see, e.g., FIGS. 5 and 10). Alternatively, connector 40 may include its own circuitry that allows communication between circuitry 32 of module 30 and circuitry 17 of board 11.

Track 42 may receive and guide tray 20 towards an appropriate position that functionally aligns electronic circuitry 32 of module 30 with coupling circuitry 17 of board 11. However, connector 40 may also be provided with one or more tray retainers or retaining elements 46 for retaining tray 20 once tray 20 has been fully inserted into connector 40 through opening 19 of housing 18 and has reached a functional alignment with board 11. The one or more tray retainers 46 of connector 40 can be provided to retain tray 20 not only such that electronic circuitry 32 of module 30 remains properly aligned with coupling circuitry 17 of circuit board 11 when loaded into holder 24 of tray 20, but also such that end 21 of tray 20 is at least substantially flush with the surface of housing 18 about opening 19.

For example, connector 40 can include first and second tray retaining elements 46A and 46B on opposite sides of hole 45. Each retaining element 46 can include base 47, head 49, and arm 48 extending between base 47 and head 49. Base 47 can cooperate with arm 48 such that the flexibility of retainer 46 may allow head 49 to pivot from its original position with respect to base 47 (e.g., in the general directions of arrows 46') when an external force is exerted upon head 49 (e.g., by end 23 of tray 20). Moreover, base 47 can cooperate with arm 48 such that the bias of retainer 46 may exert its own force on head 49, in a direction opposite to that exerted by the external force, to attempt to return head 49 to its original position with respect to base 47 (e.g., the position of head 49 with respect to base 47 as shown in FIG. 5, wherein heads 49A and 49B are separated by a distance D).

Figure 9:
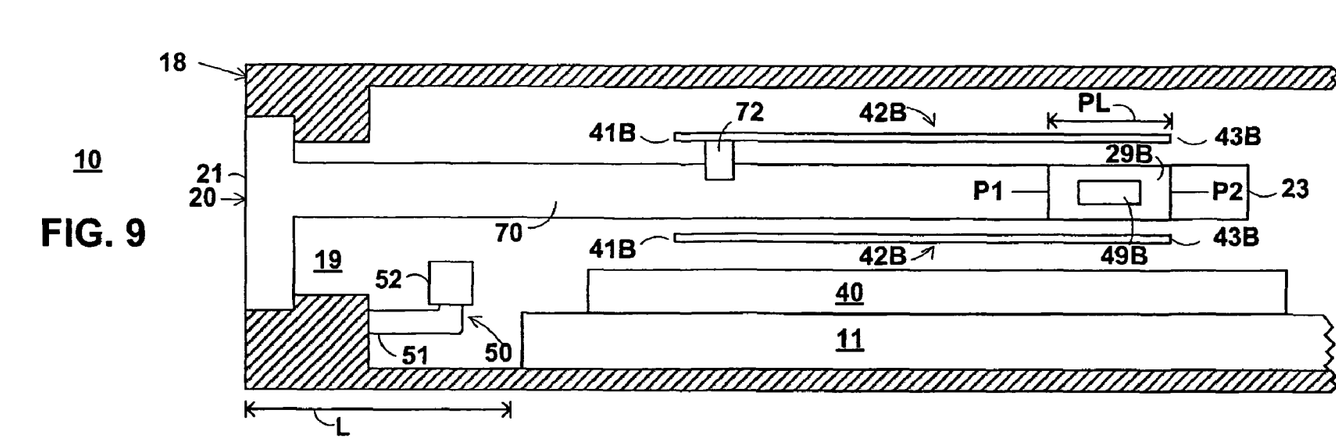
FIG. 9 is a vertical cross-sectional view of the personal electronic device of FIGS. 1, 2, and 5-8, taken from line 9-9 of FIG. 6.

For example, as shown in FIG. 5, heads 49A and 49B of tray retainers 46A and 46B, respectively, can be separated by a distance D when each head is in its original position with respect to its base. However, as shown in FIG. 6, for example, heads 49A and 49B can be separated by a distance D' that is equal to or greater than distance D. This can be due to the fact that heads 49A and 49B can extend through guide rails 42A and 42B, respectively, and can retain a portion of tray 20 therebetween by exerting the force exerted by the bias of retainers 46A and 46B on that portion of tray 20. As shown in FIGS. 6 and 9, heads 49A and 49B can, for example, contact and exert their biasing force on tray 20 within respective grooved or notched portions 29A and 29B along the sides of tray 20.

Figure 11:
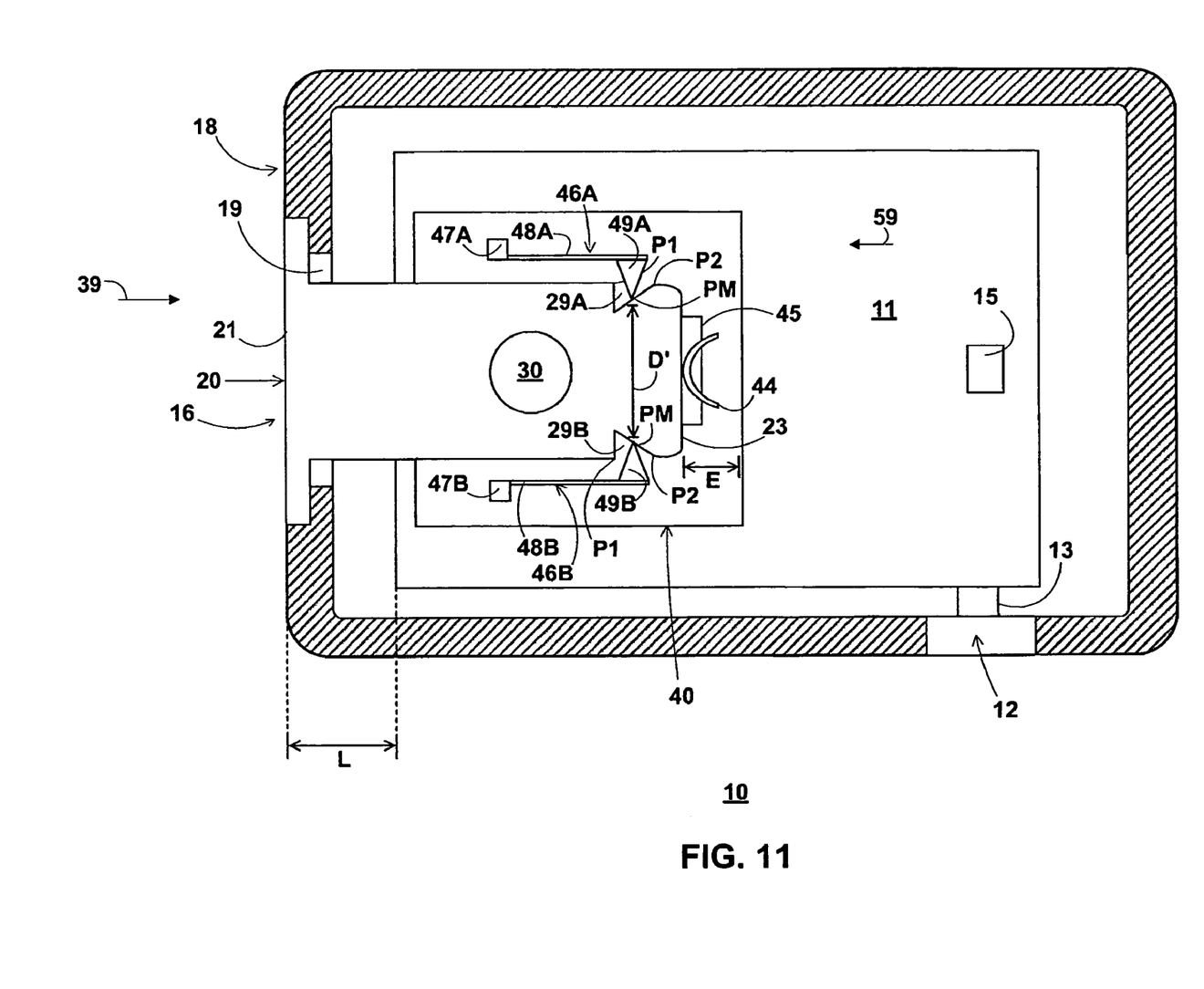
FIG. 11 is a vertical cross-sectional view of the personal electronic device of FIGS. 1, 2, and 5-10, similar to FIG. 10, but with portions of an ejectable component assembly removed.
Figure 12:
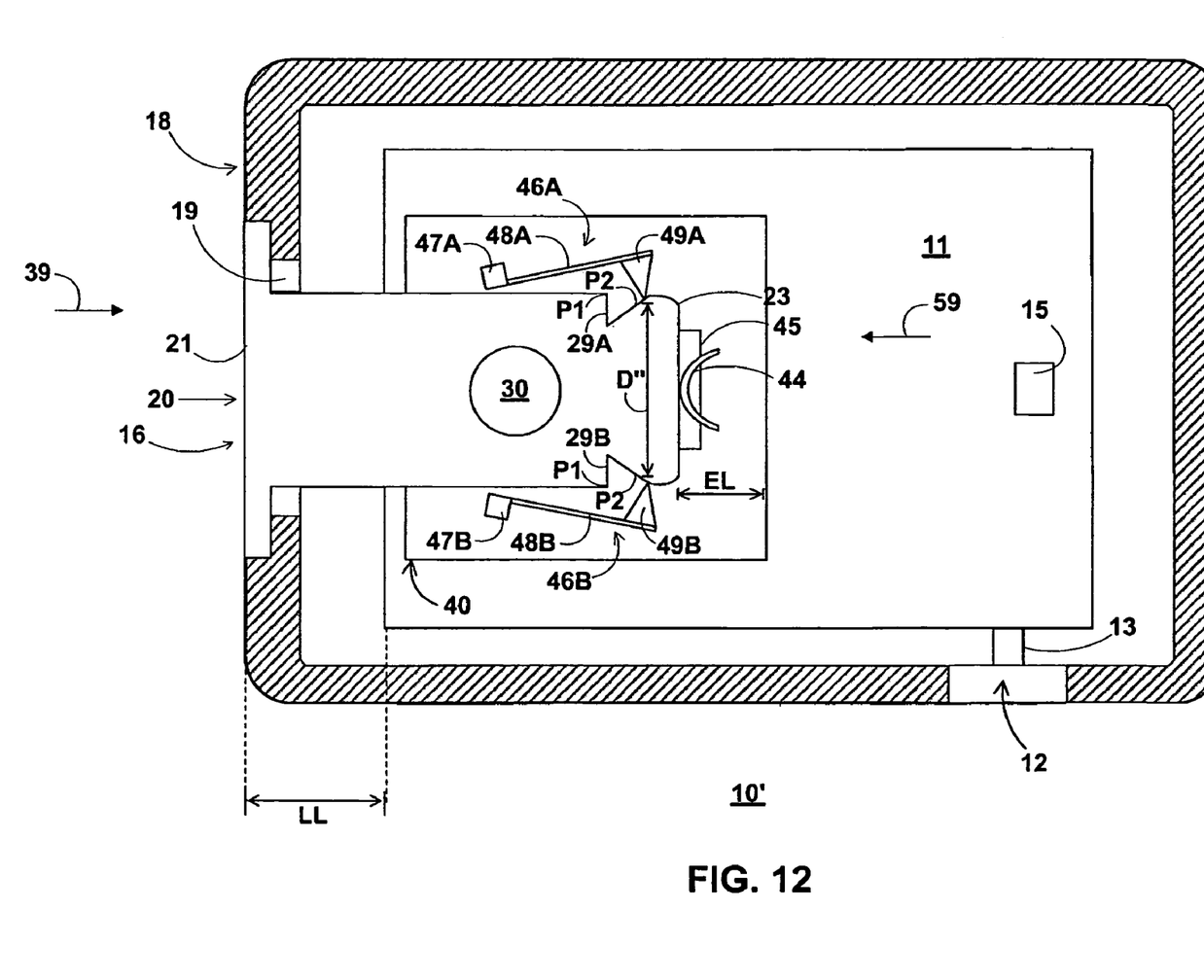
FIG. 12 is a vertical cross-sectional view, similar to FIG. 11, of an alternative embodiment of a personal electronic device in accordance with the principles of the present invention.
Figure 13:
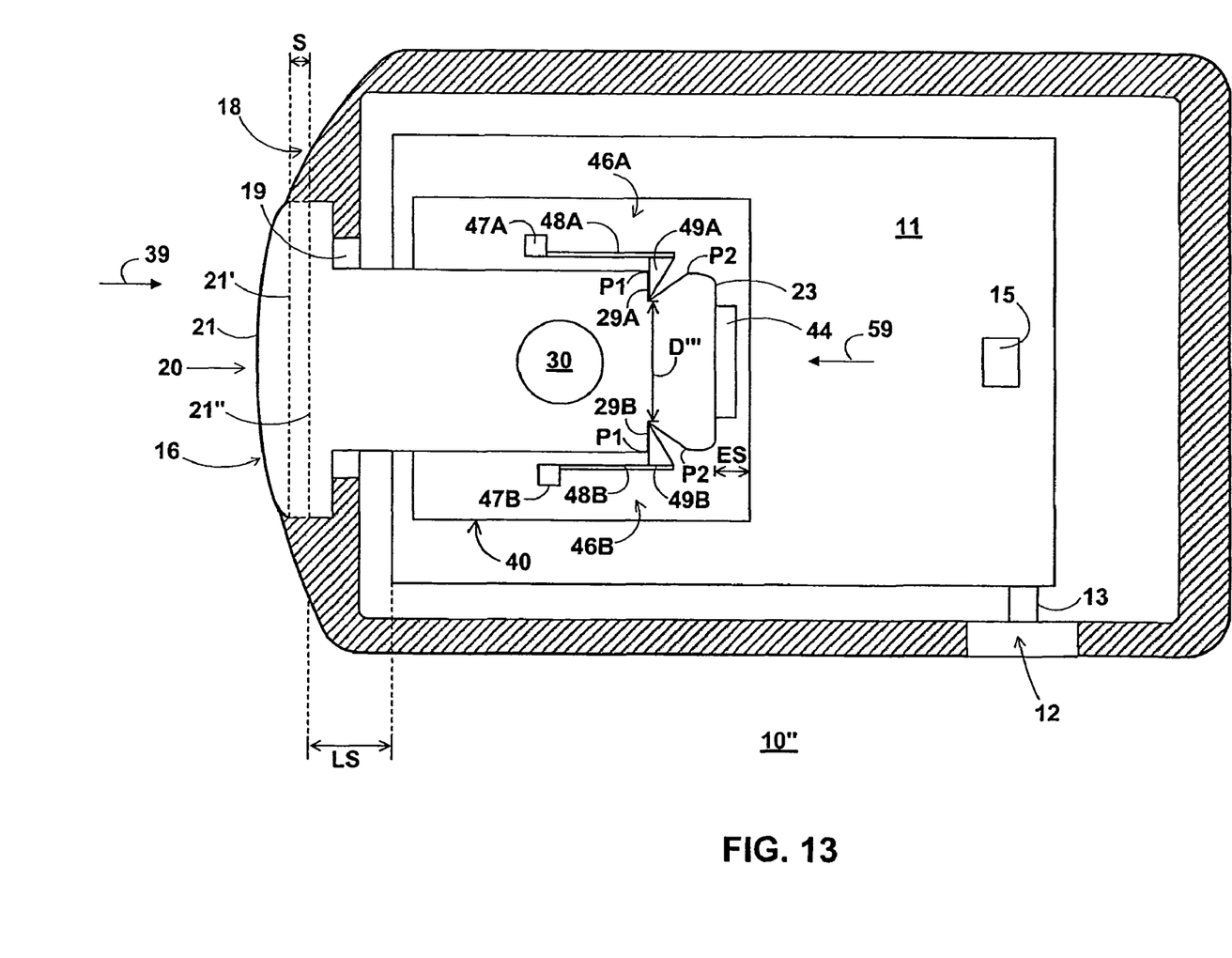
FIG. 13 is a vertical cross-sectional view, similar to FIG. 11, of another alternative embodiment of a personal electronic device in accordance with the principles of the present invention.

The length of distance L between the external surface of housing 18 about opening 19 and circuit board 11 (see, e.g., FIGS. 5 and 9), and thereby the length of distance L' between that surface and coupling circuitry 17 (see, e.g., FIGS. 5 and 10), can vary significantly because of inconsistencies in the ways in which each of the various parts of device 10 are fabricated and assembled together. Connector 40 of ejectable component assembly 16 may be able to tolerate these changes in the length of distances L and L', and, regardless of these manufacturing variations, may be able to ensure that tray 20 is pulled into and retained by connector 40 in such a way that end 21 of tray 20 is at least substantially flush with the surface of housing 18 about opening 19 and does not jut out beyond that surface, for example. As shown in FIGS. 11-13, for example, variations in the length of distance L between the surface of housing 18 about opening 19 and circuit board 11 can be absorbed by the ability of tray retainer 46 to pull tray 20 as far as possible in the direction of arrow 39 to its fully loaded position. Moreover, these manufacturing variations can be absorbed by the ability of tray retainer 46 to retain tray 20 at that fully loaded position, such that the interaction of end 21 of tray 20 with the portions of housing 18 about opening 19 can define how far tray 20 may be pulled in the direction of arrow 39 to its fully loaded position by retainer 46.

As shown in FIG. 11, which may be similar to FIG. 6, but with track 42 and tray ejector 50 (described in more detail below) removed for the sake of clarity, circuit board 11 can be manufactured into device 10 in such a way that it is separated by the surface of housing 18 about opening 19 by a distance L, and, thus, in such a way that second end 23 of tray 20 in its fully loaded position is separated by the end of connector 40 by distance E. In this embodiment of device 10, for example, upon insertion of tray 20 into connector 40 in the direction of arrow 39, heads 49A and 49B of retainer 46 may slide along and exert their biasing force on the sides of tray 20 until they finally maintain and hold their positions at points PM within respective grooves 29A and 29B that are substantially halfway therealong between end points P1 and P2 of the grooves.

The biasing force of retainer 46 may attempt to push heads 49A and 49B closer together (i.e., to reduce the length of distance D' therebetween to that of original distance D (see, e.g., FIG. 5)), for example, by sliding heads 49 along their respective grooves in the direction of arrow 59 from points PM towards points P1. However, the movement of tray 20 in the direction of arrow 39 that would be required for this sliding of heads 49 towards points P1 can be prevented by the interaction of end 21 of tray 20 with the portions of housing 18 about opening 19.

Moreover, the slope of grooves 29 from points P1 to P2 along with the biasing force of retainer 46 to reduce the length of distance D' can prevent heads 49 from sliding from points PM towards points P2, and therefore can prevent tray 20 from moving in the direction of arrow 59 with respect to housing 18. Therefore, as shown in FIG. 11, the interaction of the geometry of grooves 29 and the biasing force exerted by heads 49 of retainer 46 therein (e.g., at points PM) can pull tray 20 as far as possible in the direction of arrow 39 to its fully loaded position. Furthermore, this interaction of the geometry of grooves 29 and the biasing force exerted by heads 49 of retainer 46 therein can retain tray 20 at that position such that the interaction of end 21 of tray 20 with the portions of housing 18 about opening 19 can define how far tray 20 is pulled in the direction of arrow 39 to its fully loaded position by retainer 46.

FIG. 12 shows device 10', which can be similar to device 10 of FIGS. 1-11, except that, in this embodiment, circuit board 11 can be manufactured into device 10' such that it is separated by the surface of housing 18 about opening 19 by a distance LL that may be substantially longer than distance L of FIG. 11. Likewise, circuit board 11 can be manufactured into device 10' in such a way that second end 23 of tray 20 in its fully loaded position can be separated by the end of connector 40 by a distance EL that may be substantially longer than distance E of FIG. 11. In this embodiment of device 10', for example, upon insertion of tray 20 into connector 40 in the direction of arrow 39, heads 49A and 49B of retainer 46 may slide along and exert their biasing force on the sides of tray 20 until they finally maintain and hold their positions substantially at points P2 within respective grooves 29A and 29B.

The biasing force of retainer 46 may attempt to push heads 49A and 49B closer together (i.e., to reduce the length of distance D" therebetween to that of original distance D (see, e.g., FIG. 5)), for example, by sliding heads 49 along their respective grooves in the direction of arrow 59 from points P2 towards points P1. However, the movement of tray 20 in the direction of arrow 39 that would be required for this sliding of heads 49 towards points P1 can be prevented by the interaction of end 21 of tray 20 with the portions of housing 18 about opening 19. Moreover, the slope of grooves 29 from points P1 to P2 along with the biasing force of retainer 46 to reduce the length of distance D" can prevent heads 49 from sliding in the direction of arrow 39 from points P2 to a portion of tray 20 outside of grooves 29, and therefore can prevent tray 20 from moving in the direction of arrow 59 with respect to housing 18.

Therefore, as shown in FIG. 12, despite the potential shift of circuit board 11 further away from opening 19 in the direction of arrow 39 to a length LL, the interaction of the geometry of grooves 29 and the biasing force exerted by heads 49 of retainer 46 therein (e.g., substantially at points P2) can pull tray 20 as far as possible in the direction of arrow 39 to its fully loaded position. Furthermore, this interaction of the geometry of grooves 29 and the biasing force exerted by heads 49 of retainer 46 therein can retain tray 20 at that position such that the interaction of end 21 of tray 20 with the portions of housing 18 about opening 19 can define how far tray 20 is pulled in the direction of arrow 39 to its fully loaded position by retainer 46.

Conversely, FIG. 13 shows illustrative device 10", which can be similar to device 10 of FIGS. 1-11, except that circuit board 11 can be manufactured into device 10" in such a way that it is separated by the surface of housing 18 about opening 19 by a distance LS that may be substantially shorter than distance L of FIG. 11. Likewise, circuit board 11 can be manufactured into device 10" in such a way that second end 23 of tray 20 in its fully loaded position is separated by the end of connector 40 by a distance ES that may be substantially shorter than distance E of FIG. 11. In this embodiment of device 10", for example, upon insertion of tray 20 into connector 40 in the direction of arrow 39, heads 49A and 49B of retainer 46 can slide along and exert their biasing force on the sides of tray 20 until they finally maintain and hold their positions substantially at points P1 within respective grooves 29A and 29B.

The biasing force of retainer 46 may attempt to push heads 49A and 49B closer together (e.g., to reduce the length of distance D''' therebetween to that of original distance D (see, e.g., FIG. 5)), for example, by sliding heads 49 along their respective grooves further in the direction of arrow 59. However, the movement of tray 20 in the direction of arrow 39 that would be required for this sliding of heads 49 further towards points P1 can be prevented by the interaction of end 21 of tray 20 with the portions of housing 18 about opening 19. Moreover, the slope of grooves 29 from points P1 to P2 along with the biasing force of retainer 46 to reduce the length of distance D''' can prevent heads 49 from sliding in the direction of arrow 39 from points P1 to points P2, and therefore can prevent tray 20 from moving in the direction of arrow 59 with respect to housing 18.

Therefore, as shown in FIG. 13, despite the potential shift of circuit board 11 closer towards opening 19 in the direction of arrow 59 to a length LS, the interaction of the geometry of grooves 29 and the biasing force exerted by heads 49 of retainer 46 therein (e.g., substantially at points P1) can pull tray 20 as far as possible in the direction of arrow 39 to its fully loaded position. Furthermore, this interaction of the geometry of grooves 29 and the biasing force exerted by heads 49 of retainer 46 therein can retain tray 20 at that position such that the interaction of end 21 of tray 20 with the portions of housing 18 about opening 19 can define how far tray 20 is pulled in the direction of arrow 39 to its fully loaded position by retainer 46. The length PL of grooves 29 of tray 20 between points P1 and P2 (see, e.g., FIG. 9) can be at least equal to the difference between the greatest potential shifts of circuit board 11 closer to and farther away from opening 19 (e.g., the difference between LL and LS) that may occur due to variations in the manufacturing of the device.

It is to be understood that, despite these manufacturing variations of device 10, the surface of end 21 of tray 20 can be any suitable shape such that it can be substantially flush with the portions of housing 18 about opening 19 when tray 20 is held in its fully loaded position by connector 40, thereby creating a smooth profile for that portion of the device. For example, as shown in FIG. 12, the surface of housing 18 about opening 19 may be substantially straight and flat, and, therefore, so can be the surface of end 21 of tray 20, linearly, with the surface of housing 18 about opening 19.

Alternatively, however, as shown in FIG. 13, the surface of housing 18 about opening 19 may be substantially curved, and, therefore, so can be the surface of end 21 of tray 20. The curvature of end 21 can be continuous with the curvature of housing 18 about opening 19 so as to create a smooth profile for that portion of the device. Moreover, the surface of end 21 of tray 20 can be any suitable shape such that it may not jut out beyond where the portion of housing 18 would be if not for opening 19 when tray 20 is held in its fully loaded position by connector 40. For example, as also shown in FIG. 13, tray 20 can instead be provided with a surface of end 21' that may be straight and flat between the curved portions of housing 18 about opening 19. Alternatively, tray 20 can be provided with a surface of end 21'' that may be sunken by a distance S within the curved portions of housing 18 about opening 19.

With continued reference to FIGS. 5-10, the ejectable component assembly can also include a tray ejecting element or tray ejector 50 for ejecting tray 20 from connector 40. Tray ejector 50 can include base 52 coupled to housing 18 by pivot 51. Extension arm 54 may not only extend from base 52 in a first direction and be coupled to user contact plate 53, but extension arm 54 may also extend from base 52 in a second direction and be coupled to tray contact plate 55. Tray ejector 50 can be provided such that base 52 and, thereby, extension arm 54 may pivot about pivot 51 in the direction of arrows 51'. Moreover, tray ejector 50 can be provided such that base 52 may be biased with respect to pivot 51 (e.g., by a spring), whereby user contact plate 53 abuts or is substantially adjacent to the interior of housing 18 about opening 19 absent any external forces that may be applied to either or both of user contact plate 53 and tray contact plate 55.

Figure 7:
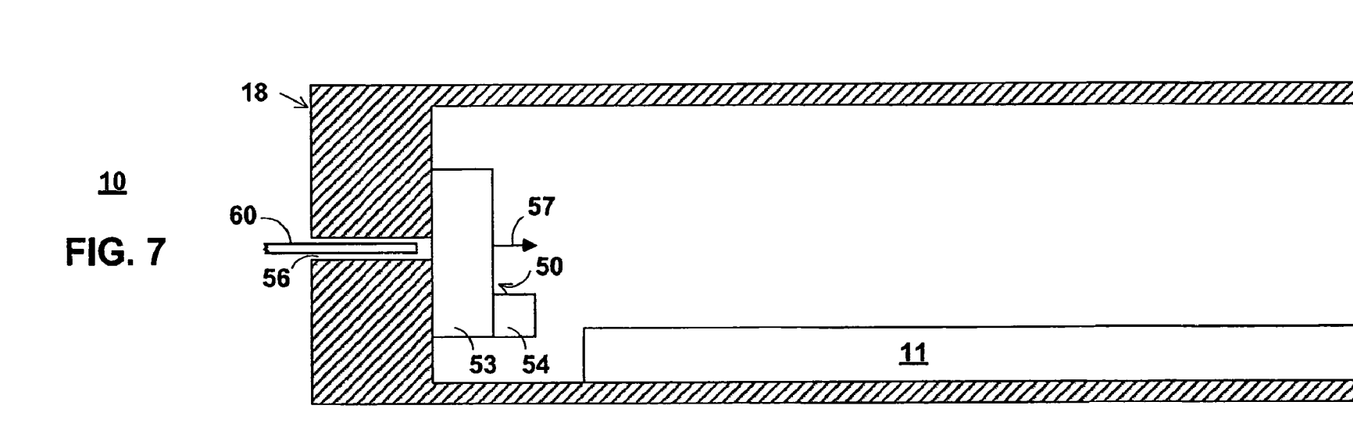
FIG. 7 is a vertical cross-sectional view of the personal electronic device of FIGS. 1, 2, 5, and 6, taken from line 7-7 of FIG. 6.
Figure 8:
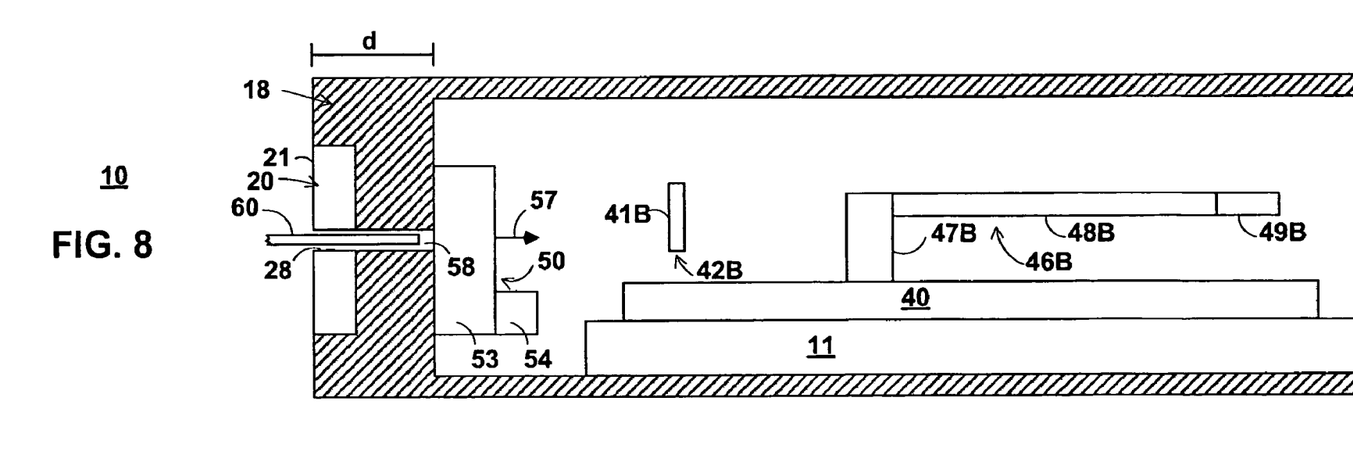
FIG. 8 is a vertical cross-sectional view of the personal electronic device of FIGS. 1, 2, and 5-7, taken from line 8-8 of FIG. 6.

A user of device 10 may eject tray 20 from connector 40, either to load tray 20 with a module 30 or to remove module 30 from tray 20, using ejector 50. For example, a user may insert a paperclip or any other suitable instrument 60 through hole 56 in housing 18 adjacent opening 19, in the direction of arrow 57 (e.g., as shown in FIG. 7), thereby exerting a force against user contact plate 53 in the direction of arrow 57. Alternatively, a user may insert paperclip or any other suitable instrument 60 through hole 28 in first end 21 of tray 20 and through hole 58 in housing 18 adjacent opening 19, in the direction of arrow 57 (e.g., as shown in FIG. 8), thereby exerting a force against user contact plate 53 in the direction of arrow 57. In any event, a force exerted by the user on user contact plate 53 in the direction of arrow 57 can pivot extension arm 54 and base 52 about pivot 51 (e.g., as shown in FIG. 9) such that a force in the direction of arrow 59 (generally opposite to that of arrow 57) can be exerted against tray 20 by tray contact plate 55 (e.g., as shown in FIG. 10), thereby forcing tray 20 in the direction of arrow 59 and releasing tray 20 from its retained position between heads 49A and 49B of tray retainer 46.

By coupling tray ejector 50 to housing 18 (e.g., by pivot 51), as opposed to coupling ejector 50 to connector 40 or board 11, ejector 50 (e.g., user contact plate 53) can be at the same distance d from the flushness of housing 18 about opening 19 with end 21 of tray 20 (see, e.g., FIG. 8) despite any variations in the distance L between board 11 and that flushness, as described above with respect to FIGS. 11-13. Therefore, the same ejector 50 can function properly, and as described above, within any device provided with an ejectable component assembly 16, regardless of any variance in the distance L between the circuit board 11 and housing 18 of the device.

Tray 20 may be formed of any suitable material such as plastic or metal, for example. However, when tray 20 is formed of a metal, such as aluminum, tray 20 can be anodized and coated such that it may be insulated and rendered substantially not conductive. Yet, despite this coating, if a user handling tray 20 has a charge, that charge could shock device 10 as the user inserts tray 20 therein. Therefore, one or more portions of an anodized metal tray 20 (see, e.g., sides 70 of tray 20 in FIGS. 1 and 9) can be laser etched to expose the conductive metal material, such that when tray is inserted into connector 40 as described above, exposed portions 70 may contact one or more grounding portions provided by connector 40 (see, e.g., grounding element 72 of track 42 in FIG. 9) to remove any charge imparted by the user onto the metal tray.

Figure 3A:
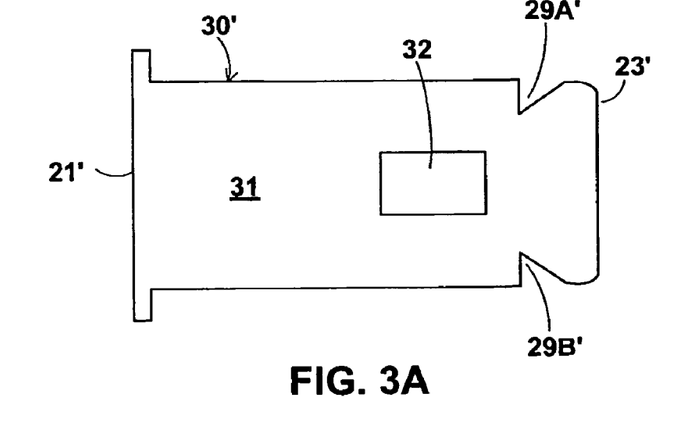
FIG. 3A is an elevational view, similar to FIG. 3, of an alternative embodiment of a removable module to be used with the personal electronic device of FIGS. 1 and 2 in accordance with the principles of the present invention.

It is to be understood that, although ejectable component assembly 16 has been described as including a connector 40 and a tray 20 for loading a removable module 30 within the connector, tray 20 may be unnecessary and any removable module to be inserted into connector 40 may be shaped with the features of tray 20. For example, as shown in FIG. 3A, a removable module 30' can be provided that may be substantially the same as removable module 30, but that also can include first end 21' shaped similarly to end 21 of tray 20, second end 33' shaped similarly to end 23 of tray 20, and grooves 29' shaped similarly to grooves 29 of tray 20, such that module 30' may be inserted into and removed from connector 40 in the same way that tray 20 may be inserted into and removed from connector 40.

While there have been described electronic devices with ejectable component assemblies that create smooth profiles with the external surfaces of the housings of the devices, despite variations in their manufacture, it is to be understood that many changes may be made therein without departing from the spirit and scope of the present invention. It will also be understood that various directional and orientational terms such as "upper" and "lower," "length" and "height," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the present invention may be of any suitable three-dimensional shape, including, but not limited to, a sphere, cone, octahedron, or combination thereof, rather than a hexahedron, as illustrated by device 10 of FIGS. 1-13. Those skilled in the art will appreciate that the invention can be practiced by other than the described embodiments, which are presented for purposes of illustration rather than of limitation, and the invention is limited only by the claims which follow.

What is claimed is:

1. An electronic device, comprising:
a housing;
a circuit board within the housing; and
a component assembly, comprising:

a tray for holding a module; and a connector coupled to the circuit board for retaining the tray in functional alignment with the circuit board when the tray is inserted in a first direction through an opening in the housing, wherein the connector is capable of exerting a retaining force at various positions on the tray to maintain the alignment for various lengths of a manufacturing distance.

2. The electronic device of claim 1, wherein the electronic device is a mobile telephone.

3. The electronic device of claim 1, wherein the electronic device is a remote control.

4. The electronic device of claim 1, wherein the manufacturing distance is a distance between the circuit board and the opening.

5. The electronic device of claim 1, wherein the manufacturing distance is a distance between the connector and the opening.

6. The electronic device of claim 1, wherein the circuit board includes coupling circuitry, and wherein the module is functionally aligned with the coupling circuitry when the module is held by the tray and the tray is retained by the connector.

7. The electronic device of claim 6, wherein the manufacturing distance is a distance between the coupling circuitry and the opening.

8. The electronic device of claim 1, wherein the connector is capable of exerting the retaining force at various positions on the tray to maintain a flushness between the tray and the housing about the opening for various lengths of the manufacturing distance.

9. The electronic device of claim 8, wherein the manufacturing distance is a distance between the circuit board and the opening.

10. The electronic device of claim 8, wherein the manufacturing distance is a distance between the connector and the opening.

11. The electronic device of claim 1, wherein the tray is metal, and wherein the connector includes at least one grounding portion for removing any charge held by the tray.

12. The electronic device of claim 11, wherein the connector further comprises:

a track for guiding the tray into the functional alignment with respect to the circuit board.

13. The electronic device of claim 12, wherein the at least one grounding portion is coupled to the track.

14. The electronic device of claim 11, wherein the electronic device is a mobile telephone.

15. The electronic device of claim 11, wherein the electronic device is a remote control.

16. The electronic device of claim 1, wherein the connector includes at least a first retainer, wherein the first retainer exerts the retaining force on a groove in the tray.

17. The electronic device of claim 16, wherein the retaining force only allows the first retainer to move along the groove in the first direction.

18. The electronic device of claim 16, wherein the groove has a length equal to an expected manufacturing variance in the manufacturing distance, and wherein the manufacturing distance is the distance between the circuit board and the opening.

19. The electronic device of claim 16, further comprising an ejector coupled to the housing, wherein the ejector includes a first contact plate, wherein the first contact plate is operative to exert an ejection force in a second direction on the tray that is greater than the retaining force of the first retainer, and wherein the second direction is opposite to the first direction.

20. An electronic device, comprising:

a circuit board with coupling circuitry;

a housing enclosing the circuit board; and an ejectable component assembly, the ejectable component assembly comprising:

a connector coupled to the circuit board for retaining a removable module when the module is inserted through an opening in the housing; and an ejector coupled to the housing for ejecting the module from the connector when the module is retained by the connector.

21. The electronic device of claim 20, wherein, when the module is retained by the connector, the connector functionally aligns the module with the coupling circuitry, despite any variance in the distance between the coupling circuitry and the opening.

22. The electronic device of claim 20, wherein, when the module is retained by the connector, the module and the housing about the opening provide a smooth profile, despite any variance in the distance between the coupling circuitry and the opening.

23. The electronic device of claim 20, wherein the electronic device is a mobile telephone.

24. The electronic device of claim 20, wherein the electronic device is a remote control.

25. The electronic device of claim 20, wherein the ejectable component assembly further comprises a tray for holding the removable module, and wherein the connector retains the tray when the tray is inserted through the opening.

26. The electronic device of claim 25, wherein, when the module is held by the tray and when the tray is retained by the connector, the tray and the housing about the opening provide a smooth profile, despite any variance in the distance between the coupling circuitry and the opening.

27. An electronic device, comprising:

a circuit board with coupling circuitry;

a housing about the circuit board; and an ejectable component assembly, the ejectable component assembly comprising:

a tray for holding a removable module; and a connector coupled to the circuit board for receiving the tray when the tray is inserted in a first direction through an opening in the housing, wherein the connector includes at least one retainer for exerting a retaining force on the tray when the connector is receiving the tray, wherein the retaining force allows the tray to move in the first direction, and wherein the retaining force prohibits the tray from moving in a second direction opposite to the first direction.

28. The electronic device of claim 27, wherein the electronic device is a mobile telephone.

29. The electronic device of claim 27, wherein the electronic device is a remote control.

30. The electronic device of claim 27, wherein, when the module is held by the tray, the retaining force retains the tray in a retained position that functionally aligns the module with the coupling circuitry, despite any variance in the distance between the coupling circuitry and the opening.

31. The electronic device of claim 27, wherein, when the module is held by the tray, the retaining force retains the tray in a retained position that provides a smooth profile between the tray and the housing about the opening.

32. An ejectable component assembly for passing a removable module through an opening in a housing of an electronic device and aligning the module with a circuit board within the housing, the assembly comprising:
- a connector within the housing for retaining the module when the module is inserted in a first direction through the opening; and
- an ejector coupled to the housing for ejecting the module from the connector in a second direction opposite to the first direction.

33. The ejectable component assembly of claim 32, wherein the electronic device is a mobile telephone.

34. The ejectable component assembly of claim 32, wherein the electronic device is a remote control.

35. The ejectable component assembly of claim 32, wherein the ejector comprises:
- a base that pivots about a portion of the housing;
- an extension arm coupled to the base;
- a user contact plate coupled to a first portion of the extension arm; and
- a module contact plate coupled to a second portion of the extension arm, wherein the module contact plate exerts a force in the second direction on the module when a force in the first direction is exerted on the user contact plate.

36. The ejectable component assembly of claim 35, wherein the force in the first direction is exerted on the user contact plate through a hole in the housing.

37. The ejectable component assembly of claim 35 further comprising:
- a tray for holding the module, wherein the connector retains the tray when the tray is inserted in the first direction through the opening, and wherein the module contact plate exerts the force in the second direction on the tray.

38. The ejectable component assembly of claim 35 further comprising:
- a tray for holding the module, wherein the connector retains the tray when the tray is inserted in the first direction through the opening, and wherein the force in the first direction is exerted on the user contact plate through a hole in the housing.

39. The ejectable component assembly of claim 35 further comprising:
- a tray for holding the module, wherein the connector retains the tray when the tray is inserted in the first direction through the opening, and wherein the force in the first direction is exerted on the user contact plate through a hole in the tray.

40. A method for retaining a removable module within a connector of an ejectable component assembly of an electronic device, wherein the device includes a housing having an opening therethrough, the method comprising:
- inserting the module in a first direction through the opening until the module reaches a first position that creates a flush surface between an end of the module and the external portions of the housing about the opening; and
- retaining the module in the first position by exerting a retention force on the module that prohibits the module from moving in a second direction opposite to the first direction but that allows the module to move in the first direction.

41. The method of claim 40, wherein, when the module is in the first position, the tray is prohibited from moving in the first direction by the external portions of the housing about the opening.

42. A method for ejecting a tray from within a connector of an ejectable component assembly of an electronic device, wherein the assembly includes an ejector having a base coupled to a housing of the device and first and second contact plates coupled to the base, the method comprising:
- applying a first force in a first direction to the first contact plate such that the second contact plate exerts a second force in a second direction to the tray for ejecting the tray from the connector.

43. The method of claim 42, wherein the applying the first force to the first contact plate comprises applying the first force through a hole in the tray.

44. The method of claim 42, wherein the applying the first force to the first contact plate comprises applying the first force through a hole in the housing.

45. A method for retaining a removable module within a connector of an ejectable component assembly of an electronic device, wherein the device includes a housing having an opening therethrough, the method comprising:
- inserting the module through the opening until the module reaches a first position that creates a smooth profile between the module and the housing about the opening; and
- retaining the module in the first position by exerting a retention force at various points on the module to maintain the smooth profile for respective various lengths of a manufacturing distance of the device.

46. The method of claim 45, wherein the manufacturing distance is a distance between the connector and the opening.

47. A mobile telephone, comprising:
- a circuit board;
- a housing about the circuit board; and
- an ejectable component assembly, the ejectable component assembly comprising:
  - a tray for holding a removable module; and
  - a connector coupled to the circuit board for receiving the tray when the tray is inserted through an opening in the housing, wherein the connector includes at least one retainer for exerting a retaining force in a groove on the tray when the connector is receiving the tray, wherein the retaining force retains the tray in a retained position that provides a flushness between the tray and the housing about the opening, and wherein the retainer is capable of exerting the retaining force at various positions along the groove to maintain the flushness when a manufacturing distance is varied.

48. The mobile telephone of claim 47, wherein the manufacturing distance is a distance between the circuit board and the opening.

49. The mobile telephone of claim 47, wherein the manufacturing distance is a distance between the connector and the opening.

50. The mobile telephone of claim 47, wherein the circuit board includes coupling circuitry, and wherein the module is functionally aligned with the coupling circuitry when the tray is retained in the retained position.

51. The mobile telephone of claim 50, wherein the manufacturing distance is a distance between the coupling circuitry and the opening.

* * * * *